United States Patent [19]

Winebarger

[11] Patent Number: 5,175,124
[45] Date of Patent: Dec. 29, 1992

[54] PROCESS FOR FABRICATING A SEMICONDUCTOR DEVICE USING RE-IONIZED RINSE WATER

[75] Inventor: Paul M. Winebarger, Austin, Tex.

[73] Assignee: Motorola, Inc., Schaumburg, Ill.

[21] Appl. No.: 674,000

[22] Filed: Mar. 25, 1991

[51] Int. Cl.⁵ .......................................... H01L 21/44
[52] U.S. Cl. ................... 437/180; 437/225; 437/229; 156/638; 156/659.1
[58] Field of Search ............ 437/225, 180, 229; 156/638, 659.1

[56] References Cited

U.S. PATENT DOCUMENTS

| | | | |
|---|---|---|---|
| 4,997,746 | 3/1991 | Greco et al. | 437/229 |
| 5,025,597 | 6/1991 | Tada et al. | 51/320 |

FOREIGN PATENT DOCUMENTS

| | | |
|---|---|---|
| 58-7831 | 1/1983 | Japan. |
| 59-168446 | 9/1984 | Japan. |
| 60-876 | 1/1985 | Japan. |
| 60-165726 | 8/1985 | Japan. |
| 61-268391 | 11/1986 | Japan. |

OTHER PUBLICATIONS

Translation of JP 61-268391 (Sakamoto et al.).
"Microcorrosion of Al-Cu and Al-Cu-Si Alloys: Interaction of the Metallization with Subsequent Photolithographic Processing", by D. Weston et al., J. Vac. Sci. Tech., vol. 8, No. 3, May/Jun. 1990.
"Immersion Develop Rinse Water Injection Process to Eliminate Positive Photoresist Scumming", by Paul M. Winebarger, Motorola Technical Developments, vol. 8, pp. 9-10, Oct. 1988.

Primary Examiner—Brian E. Hearn
Assistant Examiner—Laura M. Holtzman
Attorney, Agent, or Firm—Patricia S. Goddard

[57] ABSTRACT

A process for fabricating a semiconductor device uses re-ionized water, such as carbonated water, to rinse the device while preventing microcorrosion of metal layers. In one embodiment of the invention, a semiconductor wafer is provided having an overlying metal layer and a patterned layer overlying the overlying metal layer. Selected portions of the overlying metal layer are etched using the patterned layer as an etch mask. The patterned layer is removed by immersing the device in an organic solution without affecting the remaining metal layer. The device is then rinsed in a reservoir of re-ionized water to remove the organic solution from the device while preventing microcorrosion of the remaining metal layer.

17 Claims, 1 Drawing Sheet

PROCESS FOR FABRICATING A SEMICONDUCTOR DEVICE USING RE-IONIZED RINSE WATER

TECHNICAL FIELD OF THE INVENTION

The present invention relates to fabricating semiconductor devices in general, and more specifically, to fabricating semiconductor devices while preventing metal microcorrosion which occurs during water rinses.

BACKGROUND OF THE INVENTION

In the fabrication of semiconductor devices, lithography is commonly used to form and pattern various layers of a device. Many lithography techniques, particularly photolithography techniques, have become standard practice in the semiconductor industry. For instance, photolithography is used to mask portions of a layer of a device such that only selected portions of the device are either doped or etched. A common photolithographic operation sequence includes depositing a layer of photoresist onto a layer of a semiconductor device before exposing selected portions of the photoresist layer to radiation. The photoresist layer is then developed in a developer solution which either removes portions of the photoresist layer which were removes exposed to radiation in the case of using a positive photoresist or portions of the photoresist layer which were not exposed to radiation in the case of using a negative photoresist. The semiconductor device is then rinsed, typically in de-ionized water (DI water), to completely remove the developer solution from the semiconductor device. The de-ionized water rinse is most often performed in one of two ways, either an immersion rinse in which the device is immersed in DI water or a spray rinse in which the device is sprayed with DI water. After rinsing, the semiconductor device is dried and the subsequent fabrication steps, such as ion implantation, metal etch, sidewall spacer etch, and the like, are completed and the photoresist layer is removed. Photoresist is usually removed either by immersion in an organic solution which dissolves or strips the resist from the device or by ashing the photoresist from the device using a plasma asher. Photoresist may also be removed using various acid solutions provided the semiconductor device has no exposed metal.

A problem has arisen in using common photolithography techniques for defining or patterning certain metal layers on semiconductor devices, particularly metal layers which contain copper. Copper is frequently alloyed with aluminum to reduce hillock formation and to improve aluminum's resistance to electromigration. However, the presence of copper in a metal layer creates a problem of metal microcorrosion during certain photolithography operations. The microcorrosion, also known as pitting, is caused by a galvanic reaction between copper precipitates, namely $Al_2Cu$ precipitates, near the metal surface and aluminum surrounding the precipitates. Initially, it was believed that the developing solution used to develop the photoresist or the organic solution used to strip the photoresist from the device caused microcorrosion. However, experiments have shown that it is not the developing solution or the organic strip solution, but rather the DI water rinse which follows developing and photoresist stripping, that induces metal microcorrosion. One possible result of such metal microcorrosion is that voids form in metal lines, thereby making a metal line discontinuous and unable to carry a signal. Another possible result is that two lines may be shorted together due to an inadequate metal etch. As the metal corrodes, aluminum oxide forms near the copper precipitate. The aluminum oxide acts as an etch mask during subsequent etching operations such that unwanted metal remains on the device surface, potentially short-circuiting adjacent metal lines.

Because it is essential that semiconductor devices are rinsed following immersion in a developing solution or in an organic photoresist strip solution to prevent contamination of the semiconductor device, some solutions to the problem of microcorrosion are known to have been implemented, none of which completely eliminate the problem. One solution is to make the amount of time a semiconductor device is immersed in the rinse water as short as possible. The less time the device is in DI water, the lower the degree of microcorrosion. However, shortening the time a device is immersed in the rinse water also reduces the adequacy of the rinse. Another potential solution is to rinse the semiconductor device by spraying DI water over the device. By spraying rather than immersing, the amount of time any one area of the device is surrounded by water is reduced and microcorrosion is minimized. However, spray rinsing is not suitable for use in certain applications, for instance in rinsing wafers following an immersion photoresist develop step. Using a spray rinse, the wafers are individually and sequentially rinsed after immersion develop such that the time a wafer is subjected to the developer solution varies depending on the point at which that particular wafer is rinsed. Thus, spray rinsing after an immersion develop operation would result in non-uniform developing of the photoresist, therefore a batch rinse is preferred. In a batch rinse, all wafers are subjected to the developer solution for the same period of time and then simultaneously rinsed, thereby all wafers are developed uniformly. Spray rinsing has other disadvantages. Spray rinsing reduces throughput during fabrication and equipment used in spray rinsing is more expensive than batch rinsing equipment. Furthermore, as semiconductor wafer size increases, batch rinsing will be favored since high pressure spraying can cause substantial damage to larger, more fragile wafers.

Therefore, a need exists for an improved semiconductor fabrication process, and more specifically a process for rinsing semiconductor devices having a metal layer which minimizes microcorrosion of the metal layer, which is easily implemented with existing immersion-type rinse equipment, and which does not increase fabrication cost or number of fabrication steps.

BRIEF SUMMARY OF THE INVENTION

The present invention overcomes the previously described metal microcorrosion problems in semiconductor devices. In accordance with the present invention, a process for fabricating a semiconductor device uses re-ionized rinse water to prevent metal microcorrosion. In one form, a semiconductor wafer is provided having an overlying metal layer. A patterned layer overlies the overlying metal layer. Selected portions of the overlying metal layer are etched using the patterned layer as an etch mask. The patterned layer is removed by immersing the device in an organic solution without substantially altering remaining portions of the overlying metal layer. The semiconductor device is rinsed in a reservoir of re-ionized water to remove the organic solution from the semiconductor device while preventing microcorrosion of the remaining portions of the overlying metal layer.

DETAILED DESCRIPTION OF A PREFERRED EMBODIMENT

The present invention overcomes microcorrosion in metals used in semiconductor fabrication. Microcorrosion has been demonstrated to be caused by de-ionized (DI) water rinses which occur after photoresist strip in an organic solution or after photoresist immersion develop. The present invention essentially eliminates microcorrosion by rinsing semiconductor devices in re-ionized water, such as carbonated water, after photoresist strip and/or after photoresist immersion develop.

Figure 1:
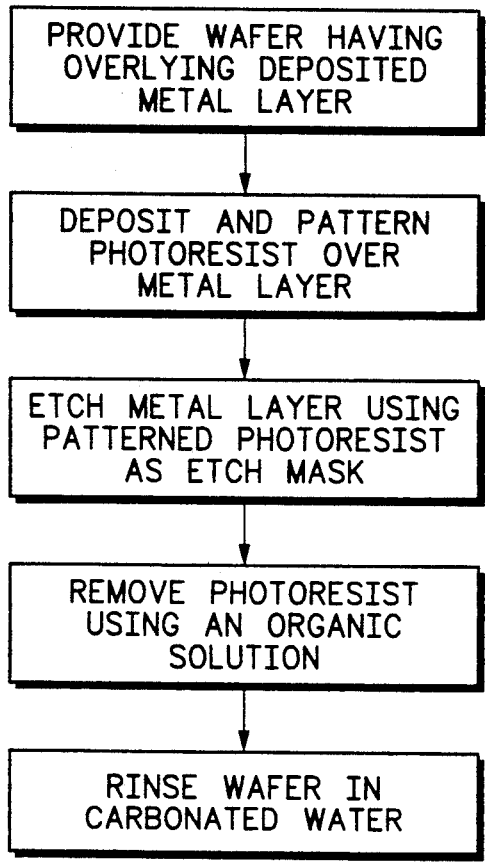
FIG. 1 is a semiconductor fabrication process flow in accordance with the present invention relating to photoresist stripping in an organic solution.

Illustrated in FIG. 1 is a semiconductor process flow in accordance with the present invention which describes an embodiment of the invention relating to photoresist stripping in an organic solution. A semiconductor wafer is provided which has an overlying metal layer. The wafer is of a common semiconducting substrate material such as silicon or gallium arsenide. The overlying metal layer is preferably a metal alloyed with copper, although any metal which is susceptible to microcorrosion caused by certain photolithographic operations may also be used. Typical copper-alloyed metals used in semiconductor fabrication are aluminum-copper alloys and aluminum-copper-silicon alloys, each of which are suitable for use in the present invention. In addition to the overlying metal layer, the semiconductor wafer may have various insulating layers or other metal layers located between the wafer and the overlying metal layer.

Photoresist is deposited over the overlying metal layer and then patterned in a predetermined pattern using known photolithography techniques. While positive photoresist is more commonly used, negative photoresist or another imagable material may also be employed in accordance with the present invention. Upon patterning the photoresist layer, portions of the metal layer are exposed. The exposed portions of the metal layer are then etched using the patterned photoresist layer as an etch mask. In other words, the exposed portions of the metal are removed while the portions of the metal layer covered by the patterned photoresist layer remain intact. The particular etch chemistry and etch method used will depend on the composition of the metal layer, but are not critical to understanding or using the present invention.

After etching the metal layer, the photoresist layer is removed or stripped by immersing the wafer in an organic solution. Organic photoresist strip solutions commonly used in the semiconductor fabrication are typically comprised of phenol, n-methyl pyrrolidinomes, or benzyl or alkyl sulfonics. Any of these types of organic photoresist strip solutions, and others, are suitable for use in the present invention. Typically, the wafer is then immersed in DI water to rinse the organic solution from the wafer. However, as discussed previously, DI water rinses cause microcorrosion of the metal layer. The present invention resolves the microcorrosion problem by immersing the wafer in re-ionized water, for example carbonated water. Re-ionized water refers to DI water which has been made conductive. DI water has a very high resistivity because DI water is very pure. By adding a "contaminant" to the water, such as salt, metal, or $CO_2$, the water becomes conductive or re-ionized. By making the rinse water conductive, microcorrosion of the metal is prevented. Any re-ionized water will prevent microcorrosion of the metal; however, one must consider the effects the conductive water will have on the wafer. For example, acidified water is conductive, but acidified water can also contaminate or otherwise negatively affect the wafer. Therefore, a preferred type of conductive or re-ionized water to use in accordance with the present invention is one which will have no detrimental effects of the wafer, for example carbonated water.

Carbonating the rinse water can be done in any number of ways, the easiest being to bubble $CO_2$ into a reservoir of de-ionized water. The $CO_2$ in the water reacts to form carbonic acid according to the equation:

$$CO_2 + H_2O \longleftrightarrow H_3O^+ + HCO_3-.$$

However, carbonic acid is unstable and will break down into $CO_2$ and $H_2O$, thereby leaving no residue on the wafers. The concentration of $CO_2$ in the water need not be tightly controlled since there is no potential for damaging the wafer. The simplest implementation of the present invention is to completely saturate the water with $CO_2$. In saturating the water with $CO_2$, the resistivity of the water is on the order of $0.05M\Omega$ cm, although resistivities of less than $1M\Omega$ cm are also suitable. Saturating DI water with $CO_2$ has proven to be an effective inhibitor of metal microcorrosion and has shown no negative effects on appearance or performance of a semiconductor device.

Figure 2:
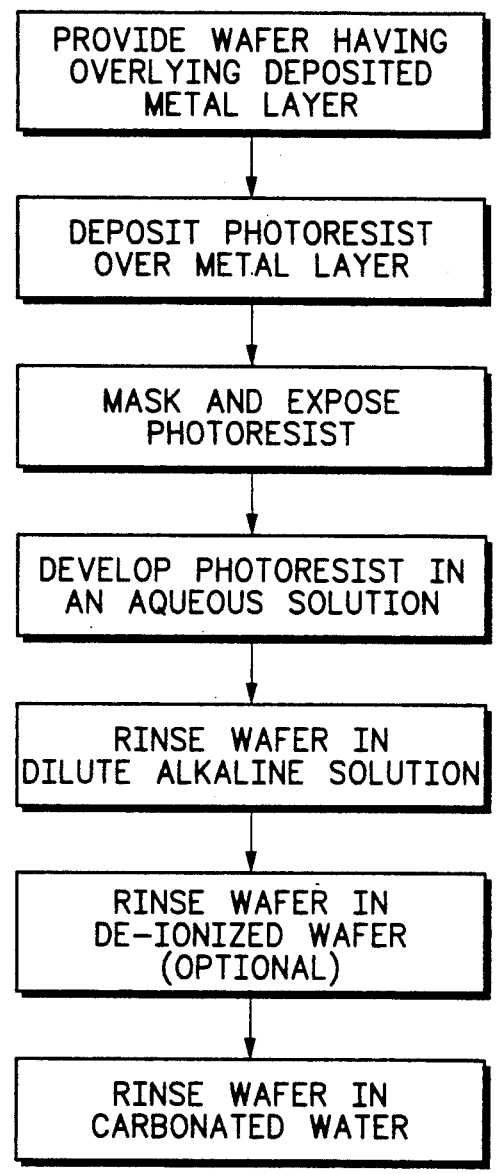
FIG. 2 is a semiconductor fabrication process flow also in accordance with the present invention relating to an immersion develop process for developing photoresist.

In another embodiment of the present invention re-ionized water is used to rinse a semiconductor wafer following a photoresist develop step, as illustrated by the process flow of FIG. 2. A semiconductor wafer is provided having an overlying metal layer. As in the previous embodiment the semiconductor wafer is silicon, gallium arsenide, or the like, and the overlying metal layer is typically aluminum alloyed with copper. Photoresist is deposited over the metal layer and selected portions of the photoresist layer are exposed to radiation using conventional masking and exposure techniques. After exposing the selected portions of the photoresist to radiation, the photoresist is developed by immersing the wafer in an aqueous, alkaline developer solution, such as TMAH (tetra methyl ammonium hydroxide). The remaining process steps will be described with respect to using positive photoresist primarily because positive photoresist is more commonly used in semiconductor fabrication. It should be understood, however, that negative photoresist processes may also benefit from this invention.

The aqueous developer solution must then be rinsed from the wafer. While rinsing the wafer in carbonated water as discussed previously will prevent metal microcorrosion, some intermediate steps are also necessary in order to prevent a problem known as "scumming." Photoresist scumming occurs as a result of rinsing a wafer having an exposed photoresist layer in neutral or acidic water. Because exposed photoresist is soluble in basic, or alkaline solutions, a neutral or acidic rinse will cause dissolved photoresist to come out of solution and precipitate onto the wafer surface. The precipitated photoresist on the wafer surface is scumlike in appearance, thus the term "scumming". To prevent scumming in general, and in using the present invention, a small amount of developer solution or other alkaline solution is injected into the rinse water. By adding a low concentration of an alkaline solution into the rinse water, the rinse water becomes slightly basic, thus preventing the photoresist from precipitating out of solution.

Therefore to rinse the aqueous developer solution from the wafer surface and to prevent scumming, a series of rinses is necessary, as illustrated in FIG. 2. The first rinse is a slightly basic rinse having a pH greater than 7. A slightly basic rinse is easily achieved by adding a small amount of an alkaline solution to de-ionized rinse water. As an example, injecting the photoresist developer solution to the rinse water to achieve a concentration of about $1 \times 10^{-3}$N has been demonstrated to prevent scumming. A dilute alkaline solution such as that described will have no effect on critical dimension control or on thickness of unexposed portions of the photoresist layer since the concentration is kept low. Alternatively, and also in accordance with the present invention, a slightly basic solution could be formed by introducing ammonia or other gas in the rinse water. Following the dilute alkaline rinse, the wafers are rinsed in a re-ionized water to thoroughly cleanse the wafers while preventing microcorrosion from proceeding. As discussed earlier, a suitable re-ionized water is carbonated water formed by introducing $CO_2$ into de-ionized water. In introducing $CO_2$ into the rinse water, it is important that $CO_2$ be prevented from entering any nearby reservoirs of developer solution. $CO_2$ will deplete the normality of the developer solution and thereby modify developing properties and parameters.

An optional rinse is included in the process flow of FIG. 2. The optional rinse is a brief rinse in DI water following the rinse in an alkaline solution and before the re-ionized water rinse. The optional rinse may be used to ease the transition of a semiconductor wafer from a basic rinse in the alkaline solution to an acidic rinse in re-ionized water. However, as noted earlier, DI water will initiate microcorrosion. To minimize the extent of microcorrosion, any rinse in pure DI water should be kept to a minimum period of time, for example less than 30 seconds.

In accordance with the present invention, replacing conventional DI water immersion-type rinses with re-ionized water immersion-type rinses, or by using DI water rinses in conjunction with re-ionzed water rinses, metal microcorrosion during semiconductor fabrication is essentially eliminated. While re-ionizing or acidifying the rinse water prevents microcorrosion, the rinse must not be detrimental to a semiconductor wafer. Therefore, a preferred type of re-ionized or acidic water to be used in accordance with the present invention is carbonated water. Carbonated water is readily available, inexpensive, and will not adversely affect the wafer. The present invention should be employed at those stages of semiconductor fabrication which are known to initiate metal microcorrosion, for example rinses after photoresist strip in an organic solution and rinses after immersion developing the photoresist.

Thus it is apparent that there has been provided, in accordance with the invention, a process for fabricating a semiconductor device that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the overlying metal layer need not be a copper alloy, but may be any metal which is susceptible to microcorrosion during semiconductor fabrication. In addition, the invention is not limited to using the substrate or wafer materials described. Also, in using carbonated water as the re-ionized water, the concentration of $CO_2$ in water need not be tightly controlled. Having the water completely saturated with $CO_2$ is satisfactory and eliminates the need for monitoring concentration. It is also understood that precipitation of photoresist during rinsing can be prevented by rinsing in any basic solution. The basic solution of the present invention is not limited to alkaline solutions formed by adding developer solution into water. Furthermore, the present invention is not limited to use in rinses related to photolithography operations. Any rinse which may initiate metal microcorrosion can benefit from the invention. Therefore, it is intended that this invention encompass all such variations and modifications as fall within the scope of the appended claims.

I claim:

1. A process for fabricating a semiconductor device using re-ionized rinse water to prevent metal microcorrosion, comprising the steps of:
   providing a semiconductor substrate;
   depositing a metal layer overlying the semiconductor substrate;
   depositing an imagable material overlying the metal layer and the semiconductor substrate;
   exposing selected portions of the imagable material to radiation;
   developing the imagable material by immersing the device in an aqueous solution such that the selected portions of the imagable material are removed; and
   rinsing the semiconductor device to remove the aqueous solution,
   wherein the step of rinsing the semiconductor device comprises the sequential steps of:
   rinsing the semiconductor device in a reservoir of basic solution to prevent precipitation of the imagable material; and
   rinsing the semiconductor device in a reservoir of re-ionized water to remove the aqueous solution and the basic solution from the device while preventing microcorrosion of the metal layer.

2. The process of claim 1 wherein the step of depositing an imagable material comprises depositing photoresist overlying the metal layer and the semiconductor substrate.

3. The process of claim 1 wherein the step of depositing a metal layer comprises depositing a metal layer comprising copper overlying the semiconductor substrate.

4. The process of claim 3 wherein the step of depositing a metal layer comprising copper comprises depositing an aluminum-copper alloy layer overlying the semiconductor substrate.

5. The process of claim 1 wherein the step of rinsing the semiconductor device in a reservoir of re-ionized water comprises rinsing the semiconductor device in a reservoir of carbonated water.

6. The process of claim 5 wherein the step of rinsing the semiconductor device in a reservoir of carbonated water to substantially remove the aqueous solution and the basic solution from the device while substantially preventing microcorrosion of the metal layer comprises:

providing a predetermined amount of de-ionized water;

introducing carbon dioxide into the de-ionized water at a predetermined rate to form saturated carbonated water; and rinsing the semiconductor device in the saturated carbonated water.

7. The process of claim 1 wherein the step of rinsing the semiconductor device in a reservoir of basic solution to prevent precipitation of the imagable material comprises rinsing the semiconductor device in a reservoir of alkaline solution having a pH greater than 7.

8. The process of claim 7 wherein the step of rinsing the semiconductor device in a reservoir of alkaline solution having a pH greater than 7 comprises rinsing the semiconductor device in a reservoir of de-ionized water to which a predetermined amount of developer solution has been added.

9. A process for fabricating a semiconductor device using re-ionized rinse water to prevent metal microcorrosion, comprising the steps of:

providing a semiconductor wafer having an overlying metal layer and a patterned layer overlying the overlying metal layer;

etching selected portions of the overlying metal layer using the patterned layer as an etch mask;

removing the patterned layer by immersing the device in an organic solution without altering remaining portions of the overlying metal layer; and then rinsing the semiconductor device in a reservoir of re-ionized water to remove the organic solution from the semiconductor device while preventing microcorrosion of the remaining portions of the overlying metal layer.

10. The process of claim 9 wherein the step of providing a semiconductor wafer having an overlying metal layer comprises providing a semiconductor wafer having an overlying metal layer comprising copper.

11. The process of claim 10 wherein the step of providing a semiconductor wafer having an overlying metal layer comprises providing a semiconductor wafer having an overlying metal layer comprising aluminum and copper.

12. The process of claim 9 wherein the step of rinsing the semiconductor device in re-ionized water comprises rinsing the semiconductor device in carbonated water.

13. The process of claim 9 wherein the step of providing a semiconductor wafer having an overlying metal layer and a patterned layer overlying the metal layer comprises providing a semiconductor wafer having an overlying metal layer and a patterned photoresist layer overlying the metal layer.

14. A process for fabricating a semiconductor device using re-ionized rinse water to prevent metal microcorrosion, comprising the steps of:

providing a semiconductor wafer having an overlying metal layer;

depositing photoresist on the overlying metal layer;

exposing selective portions of the photoresist to radiation;

developing the photoresist in an aqueous solution to remove the portions of photoresist exposed to radiation; and rinsing the semiconductor device to remove the aqueous solution, wherein the step of rinsing the semiconductor device comprises the sequential steps of:

rinsing the semiconductor device in a reservoir of alkaline solution to remove the aqueous solution from the semiconductor device and to prevent precipitation of the aqueous solution; and rinsing the semiconductor device in a reservoir of saturated carbonated water to remove traces of the aqueous solution and the alkaline solution from the semiconductor device without corroding the overlying metal layer.

15. The process of claim 14 wherein the step of rinsing the semiconductor device in a reservoir of alkaline solution comprises rinsing the semiconductor device in a reservoir of alkaline solution having a pH greater than 7.

16. A process for fabricating a semiconductor device using re-ionized rinse water to prevent metal microcorrosion, comprising the steps of:

providing a semiconductor wafer having an overlying metal layer;

depositing photoresist on the overlying metal layer;

exposing selective portions of the photoresist to radiation;

developing the photoresist in an aqueous solution to remove the portions of photoresist exposed to radiation;

rinsing the semiconductor device in a reservoir of alkaline solution to remove the aqueous solution from the semiconductor device and to prevent precipitation of the aqueous solution;

rinsing the semiconductor device in a reservoir of de-ionized water for a predetermined period of time; and after rinsing in de-ionized water, rinsing the semiconductor device in a reservoir of saturated carbonated water to remove any traces of the aqueous solution and the alkaline solution from the semiconductor device without corroding the overlying metal layer.

17. The process of claim 16 wherein the step of rinsing the semiconductor device in a reservoir of de-ionized water for a predetermined period of time comprises rinsing the semiconductor device in a reservoir of de-ionized water for a period of time less than thirty seconds.

* * * * *